US008500909B2

(12) United States Patent
Pei

(10) Patent No.: US 8,500,909 B2
(45) Date of Patent: *Aug. 6, 2013

(54) APPARATUS FOR FLATTENING COATING MATERIAL AND EVAPORATION DEPOSITION DEVICE HAVING SAME

(75) Inventor: Shao-Kai Pei, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 288 days.

This patent is subject to a terminal disclaimer.

(21) Appl. No.: 12/943,941

(22) Filed: Nov. 11, 2010

(65) Prior Publication Data

US 2012/0006267 A1 Jan. 12, 2012

(30) Foreign Application Priority Data

Jul. 7, 2010 (TW) .............................. 99122258 A

(51) Int. Cl.
C23C 16/00 (2006.01)
B05C 11/00 (2006.01)
H05H 1/00 (2006.01)
C21C 7/10 (2006.01)

(52) U.S. Cl.
USPC ........... 118/726; 118/600; 118/608; 118/729; 118/727; 427/535; 427/255.6; 266/211; 220/819; 219/121.21; 432/13; 432/238

(58) Field of Classification Search
USPC ................... 118/726, 723 VE, 50.1; 117/213; 427/497, 248.1, 69; 392/389; 220/819; 432/13, 238; 219/121.21; 266/275
See application file for complete search history.

(56) References Cited

U.S. PATENT DOCUMENTS

| 2,923,430 | A | * | 2/1960 | Stengele | 220/264 |
|---|---|---|---|---|---|
| 2,961,228 | A | * | 11/1960 | Moore | 432/262 |
| 3,195,873 | A | * | 7/1965 | Philbrick, Jr. | 266/211 |
| 3,437,328 | A | * | 4/1969 | Smith, Jr. et al. | 432/238 |
| 3,554,512 | A | * | 1/1971 | Elliott et al. | 432/233 |
| 3,983,838 | A | * | 10/1976 | Christensen | 118/730 |
| 5,092,963 | A | * | 3/1992 | Barker et al. | 202/250 |
| 5,112,644 | A | * | 5/1992 | Seddon et al. | 427/569 |
| 5,761,779 | A | * | 6/1998 | Maruyama et al. | 29/899 |
| 5,762,672 | A | * | 6/1998 | Ikeda et al. | 65/17.3 |
| 5,976,263 | A | * | 11/1999 | Poole | 118/726 |
| 6,050,466 | A | * | 4/2000 | Cronce et al. | 224/321 |
| 6,237,529 | B1 | * | 5/2001 | Spahn | 118/726 |
| 7,946,134 | B2 | * | 5/2011 | Atkins et al. | 65/412 |
| 2002/0040682 | A1 | * | 4/2002 | Ramsay | 118/723 EB |
| 2008/0191153 | A1 | * | 8/2008 | Marganski et al. | 250/492.21 |
| 2009/0099820 | A1 | * | 4/2009 | Kaplan | 702/189 |
| 2011/0139073 | A1 | * | 6/2011 | Reed et al. | 118/729 |
| 2011/0168707 | A1 | * | 7/2011 | Reeves | 220/211 |
| 2012/0012050 | A1 | * | 1/2012 | Pei | 118/47 |
| 2012/0012056 | A1 | * | 1/2012 | Pei | 118/665 |
| 2012/0186522 | A1 | * | 7/2012 | Adachi et al. | 118/726 |
| 2012/0270167 | A1 | * | 10/2012 | Sato et al. | 432/13 |
| 2012/0285374 | A1 | * | 11/2012 | Pei | 118/47 |

* cited by examiner

*Primary Examiner* — Dah-Wei Yuan
*Assistant Examiner* — Karl Kurple
(74) *Attorney, Agent, or Firm* — Altis Law Group, Inc.

(57) ABSTRACT

An apparatus for processing coating material includes a crucible having a cylindrical receptacle for receiving coating material, a drive member having a drive shaft, and a cover coupled to the drive shaft. The cover has a flat surface. The drive shaft is configured to drive the cover to rotate thereabout between a closed position where the cover covers the receptacle and the flat surface presses against the coating material to flatten the coating material, and an open position where the cover is moved away from the receptacle.

18 Claims, 3 Drawing Sheets

APPARATUS FOR FLATTENING COATING MATERIAL AND EVAPORATION DEPOSITION DEVICE HAVING SAME

BACKGROUND

1. Technical Field

The present disclosure relates to an apparatus for processing coating material and a related evaporation deposition device.

2. Description of Related Art

Evaporation deposition devices typically include a deposition chamber, a crucible, and a carrier positioned in the deposition chamber. The crucible contains powdery coating materials, and the carrier supports workpieces near the crucible. In order to keep a stable evaporation rate during the coating process, the surface of the coating material should be smooth before evaporation. Therefore, the powdery coating materials in the crucible need to be heated by high-energy electron beams. Then the melted, once powdery coating materials are compacted manually and cooled into an integral coating material with a smooth surface.

However, manual compaction is inefficient and may cause the coating materials to become polluted.

Therefore, an apparatus for processing coating material which can overcome the above-mentioned problems is desired.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Embodiments will now be described in detail below with reference to the drawings.

Figure 1:
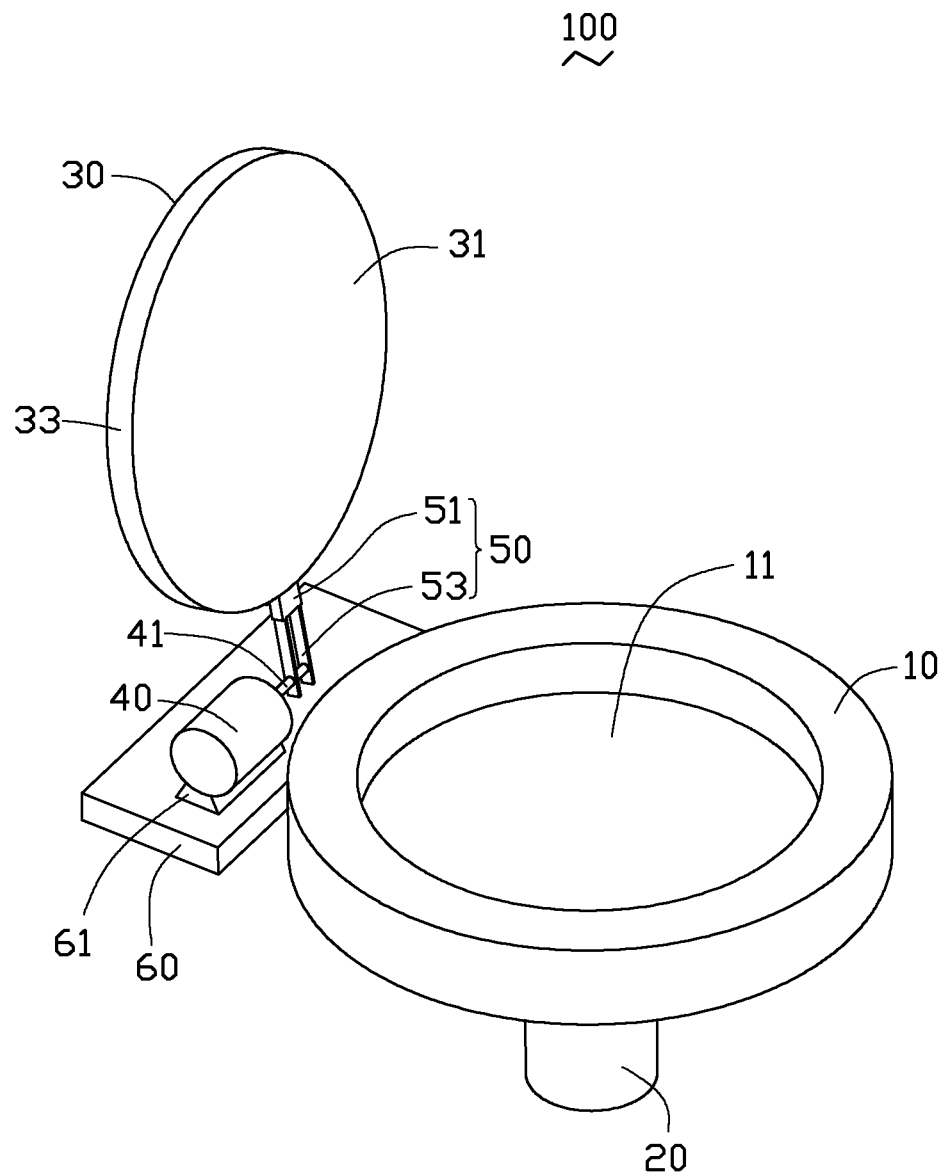
FIG. 1 is an isometric view of an apparatus for processing coating material according to a first embodiment.

Referring to FIG. 1, an apparatus 100 for processing coating material in accordance with a first embodiment is provided. The apparatus 100 includes a crucible 10, a rotating shaft 20, a cover 30, a drive member 40, and a connection arm 50.

The crucible 10 has a receptacle 11 for receiving the coating material. In this embodiment, the crucible 10 is made of tantalum, molybdenum, tungsten, or other thermally conductive metal or their alloys. The receptacle 11 is cylindrical. In alternative embodiments, the receptacle 11 may be cubic.

The rotating shaft 20 is coupled to the crucible 10. In this embodiment, the rotating shaft 20 is in the center area of the bottom of the crucible 10. The rotating shaft 20 is coaxial to the receptacle 11.

The rotating shaft 20 may be coupled to a motor so that the crucible 10 can be rotated by the rotating shaft 20.

The cover 30 is cylindrical and includes a flat surface 31 and a peripheral wall 33. The flat surface 31 is sized and shaped so that it can press and flatten the coating material received in the receptacle 11.

In this embodiment, the cover 30 is made of tantalum, molybdenum, tungsten, or other thermally conductive metal or their alloys.

The drive member 40 drives the cover 30 to press and flatten the coating material in the receptacle 11 of the crucible 10. The drive member 40 has a drive shaft 41. The drive shaft 41 is coupled to the cover 30. Therefore, the drive member 40 can operate the cover 30 to rotate around the drive shaft 41 between a closed position and an open position. When the cover 30 is in the closed position, the flat surface 31 is received in and covers the receptacle 11 and presses against the coating material to flatten the coating material. When the cover 30 is in the open position, the cover 30 is moved away from the receptacle 11.

In this embodiment, the drive member 40 is located outside the crucible 10. The drive shaft 41 is substantially perpendicular to the central axis of the receptacle 11. The distance between the central axis of the drive shaft 41 and the central axis of the receptacle 11 is equal to the distance between the central axis of the cover 30 and the central axis of the drive shaft 41.

The connection arm 50 has a connection end 51 and a coupling end 53. The coupling end 53 is opposite to the connection end 51. The connection arm 50 is configured to pivot the cover 30 between the open and the closed positions. The connection end 51 is connected to the cover 30. The coupling end 53 is coupled to the drive shaft 41 of the drive member 40.

In this embodiment, the connection end 51 of the connection arm 50 is configured to the peripheral wall 33 of the cover 30.

The apparatus 100 further includes a conveyer 60. The drive member 40 coupled to the cover 30 is mounted on the conveyer 60 with a mounting bracket 61. The conveyer 60 can move the drive member 40 and the cover 30 forward or backward to adjust the distance between the crucible 10 and the drive shaft 41.

In this embodiment, the rotating shaft 20 is a telescopic shaft, and therefore, height alignment between the crucible 10 and the cover 30 can be adjusted.

Figure 2:
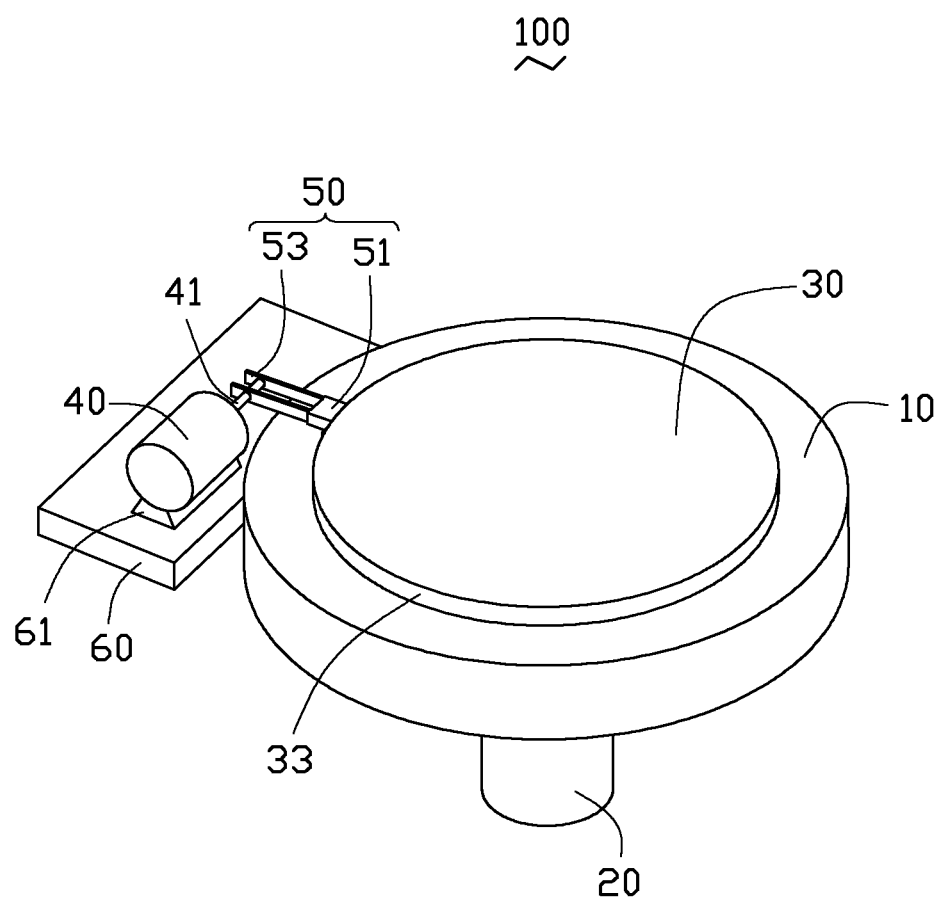
FIG. 2 is a schematic view of the apparatus of FIG. 1 in a closed position.

Referring to FIG. 2, in operation, the cover 30 is closed to cover the receptacle 11 of the crucible 10. The flat surface 31 is received in the receptacle 11 and presses against the coating material in the receptacle 11 to flatten the coating material.

In this embodiment, the drive member 40 is directly coupled to the connection arm 50. In alternative embodiments, a transmission mechanism, such as a gear assembly, may be coupled between the drive member 40 and the connection arm 50.

Figure 3:
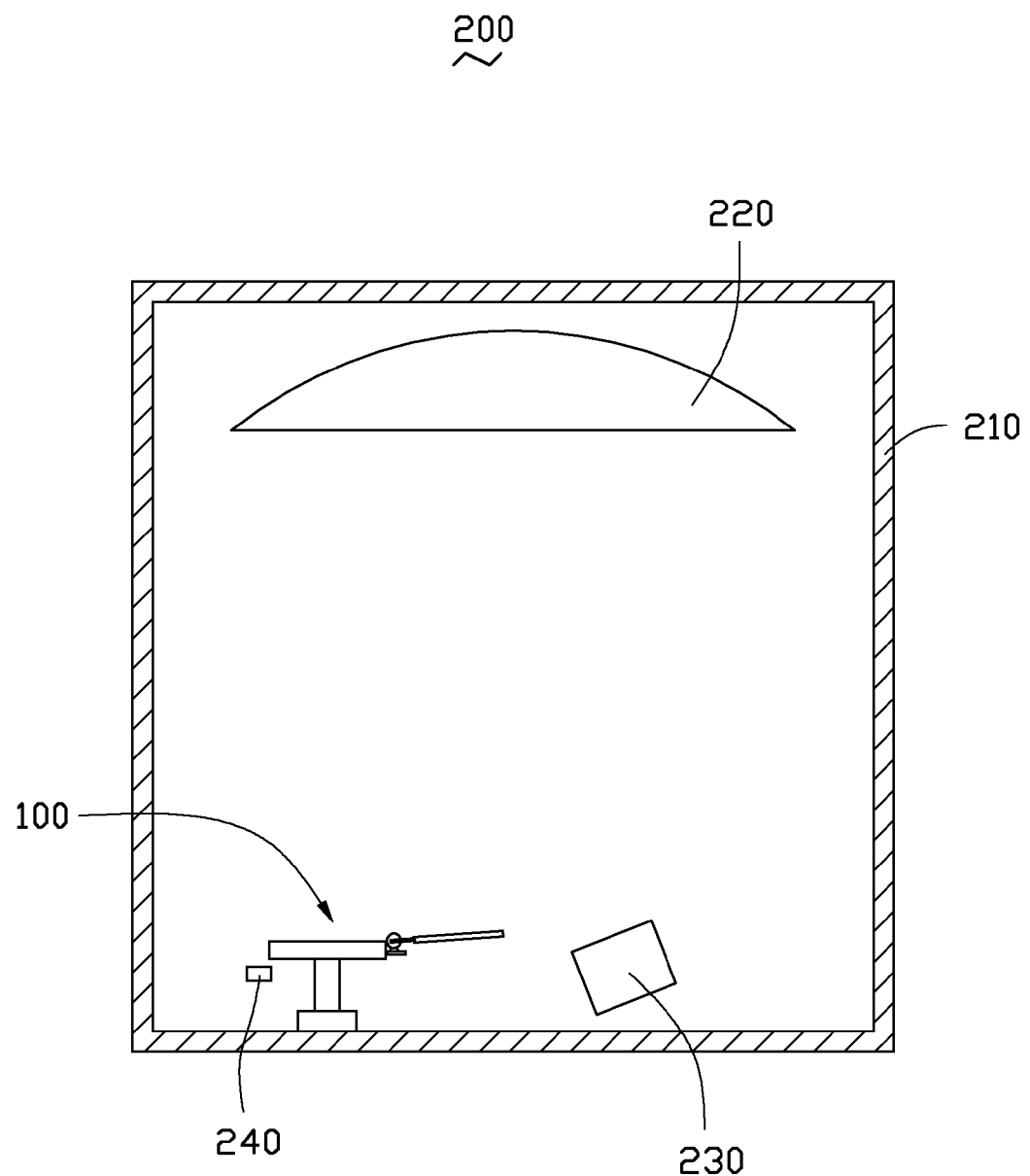
FIG. 3 is a sectional view of an evaporation deposition device according one exemplary embodiment.

Referring to FIG. 3, an evaporation deposition device 200 in accordance with an alternative embodiment is provided. The evaporation deposition device 200 includes a deposition chamber 210, a carrier 220, a plasma source 230, a heating system 240 and an apparatus 100 for processing the coating material.

The deposition chamber 210 is a vacuum chamber. The carrier 220, the plasma source 230, the heating system 240, and the apparatus 100 are all in the deposition chamber 210.

The carrier 220 supports workpieces, and keeps the workpieces aligned with the crucible 10 (not labeled in the FIG. 3) of the apparatus 100. The plasma source 230 forms plasma in the deposition chamber 210. In this embodiment, the heating system 240 is an electron gun, used to form high-energy electron beams to heat and vaporize the coating materials. Finally, the resultant materials are deposited onto the workpieces.

In this embodiment, the carrier 220 is on the top of the deposition chamber 210, and above the apparatus 100. The plasma source 230 and the crucible 10 of the apparatus 100 are below the carrier 220. The heating system 240 is beside the crucible 10.

Due to the rotatable cover 30 drive by the drive member 40, the apparatus 100 can process the powdery coating materials into an integral coating material with a smooth surface automatically. Thus, the apparatus 100 can greatly reduce the possibility of the coating material being polluted manual handling, and the procedure of processing coating material is more efficient.

It is to be understood that the above-described embodiments are intended to illustrate rather than limit the disclosure. Variations may be made to the embodiments without departing from the spirit of the disclosure. The above-described embodiments illustrate the scope of the disclosure but do not restrict the scope of the disclosure.

What is claimed is:

1. An apparatus for processing coating material, comprising:
    a crucible having a cylindrical receptacle for receiving coating material therein;
    a drive member comprising a drive shaft;
    a cover coupled to the drive shaft, the cover having a flat surface, the drive shaft configured to drive the cover to rotate thereabout between a closed position and an open position;
    wherein when the cover is in the closed position, the cover covers the receptacle, and the flat surface of the cover is received in the receptacle, presses against the coating material and flattens the coating material; and
    when the cover is in the open position, the cover is moved away from the receptacle, wherein the apparatus further comprises a conveyer, wherein the drive member is coupled to the cover, the drive member is mounted on the conveyer with a mounting bracket, and the conveyer moves the drive member and the cover forward or backward to adjust a distance between the crucible and the drive shaft.

2. The apparatus of claim 1, wherein the cover is cylindrical, and the flat surface is sized and shaped conforming to the receptacle.

3. The apparatus of claim 2, wherein the drive member is located outside the crucible to drive the cover to rotate around the drive shaft.

4. The apparatus of claim 3, further comprising a connection arm connected between the cover and the drive shaft.

5. The apparatus of claim 3, wherein the drive shaft is perpendicular to the central axis of the receptacle.

6. The apparatus of claim 1, wherein the crucible is rotatable about the central axis of the receptacle.

7. The apparatus of claim 1, wherein both the crucible and the cover are made of thermally conductive metal.

8. An evaporation deposition device, comprising:
    a deposition chamber; and
    a coating material processing apparatus arranged in the deposition chamber, the apparatus comprising:
        a crucible having a cylindrical receptacle for receiving coating material therein;
        a drive member comprising a drive shaft;
        a cover coupled to the drive shaft, the cover having a flat surface, the drive shaft configured to drive the cover to rotate thereabout between a closed position and an open position;
        wherein when the cover is in the closed position, the cover covers the receptacle, and the flat surface of the cover is received in the receptacle, presses against the coating material and flattens the coating material; and
        when the cover is in the open position, the cover is moved away from the receptacle, wherein the apparatus further comprises a conveyer, wherein the drive member is coupled to the cover, the drive member is mounted on the conveyer with a mounting bracket, and the conveyer moves the drive member and the cover forward or backward to adjust a distance between the crucible and the drive shaft.

9. The evaporation deposition device of claim 8, further comprising a support for supporting workpieces thereon, and a plasma source facing the support; wherein the support and the plasma source are received in the deposition chamber.

10. The evaporation deposition device of claim 8, wherein the cover is cylindrical, and the flat surface is sized and shaped conforming to the receptacle.

11. The evaporation deposition device of claim 10, wherein the drive member is located outside the crucible to drive the cover to rotate around the drive shaft.

12. The evaporation deposition device of claim 11, wherein the apparatus further comprises a connection arm connected between the cover and the drive shaft.

13. The evaporation deposition device of claim 11, wherein the drive shaft is perpendicular to the central axis of the receptacle.

14. The evaporation deposition device of claim 8, wherein the crucible is rotatable about the central axis of the receptacle.

15. The evaporation deposition device of claim 8, wherein both the crucible and the cover are made of thermally conductive metal.

16. The apparatus of claim 1, wherein the drive shaft is a telescopic shaft to adjust the height between the crucible and the cover.

17. The apparatus of claim 1, further comprising a transmission mechanism coupled between the drive member and the connection arm.

18. The evaporation deposition device of claim 9, wherein the support is on the top of the deposition chamber, and the plasma source and the crucible of the apparatus are below the carrier.

* * * * *